United States Patent
Janssen et al.

(10) Patent No.: US 7,330,142 B2
(45) Date of Patent: Feb. 12, 2008

(54) SIGMA-DELTA MODULATOR WITH A QUANTIZER/GAIN ELEMENT

(75) Inventors: Erwin Janssen, Eindhoven (NL); Derk Reefman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 163 days.

(21) Appl. No.: 10/552,779

(22) PCT Filed: Apr. 13, 2004

(86) PCT No.: PCT/IB2004/050424

§ 371 (c)(1),
(2), (4) Date: Oct. 12, 2005

(87) PCT Pub. No.: WO2004/093324

PCT Pub. Date: Oct. 28, 2004

(65) Prior Publication Data

US 2007/0035424 A1    Feb. 15, 2007

(30) Foreign Application Priority Data

Apr. 16, 2003    (EP) ................... 03101036

(51) Int. Cl.
*H03M 3/00* (2006.01)

(52) U.S. Cl. ..................... 341/143; 341/155

(58) Field of Classification Search ............... 341/143, 341/155, 144, 120, 118, 116
See application file for complete search history.

(56) References Cited

U.S. PATENT DOCUMENTS

| 6,064,326 | A | 5/2000 | Krone et al. |
| 6,157,331 | A | 12/2000 | Liu et al. |
| 6,424,279 | B1 | 7/2002 | Kim et al. |
| 6,831,577 | B1 * | 12/2004 | Furst ........................... 341/143 |
| 7,009,543 | B2 * | 3/2006 | Melanson ................... 341/143 |
| 7,081,843 | B2 * | 7/2006 | Melanson ................... 341/143 |

OTHER PUBLICATIONS

Tewksbury et al. Oversampled, Linear Predictive, and Noise-Shaping Coders of Order N>1, IEEE Transactions on Circuits and Systems, vol. 25, Jul. 1978.

* cited by examiner

*Primary Examiner*—Peguy JeanPierre (57) ABSTRACT

A sigma-delta modulator (SDM) including n (n>_1) integrators in series, where a first of the n integrators receiving an input signal, at least one Q device, which acts as a quantizer when an absolute value of a signal input thereto is smaller and as a gain element (either with or without offset) when the absolute value of the signal input thereto is larger, and a device for quantizing an output of the unit. The SDM may be a feed back or feed forward SDM. The SDM may include a single or multiple Q devices. The single Q device may be positioned so that the signal input to the one Q device is an output of the last integrator and the output of the one device $Q_1$ is input to the device for quantizing and/or to the n integrators. For multiple Q devices, each of the Q devices may have different parameters set to improve stability, improve SNR, and/or reduce introduction of artifacts. The SDM may be part of an analog to digital converter and/or a digital to digital converter. The SDM may process digital or analog signals, for example, a 1-bit signal.

20 Claims, 8 Drawing Sheets

SIGMA-DELTA MODULATOR WITH A QUANTIZER/GAIN ELEMENT

The present invention relates generally to a sigma-delta modulator and method thereof.

Figures 1A, 1B:
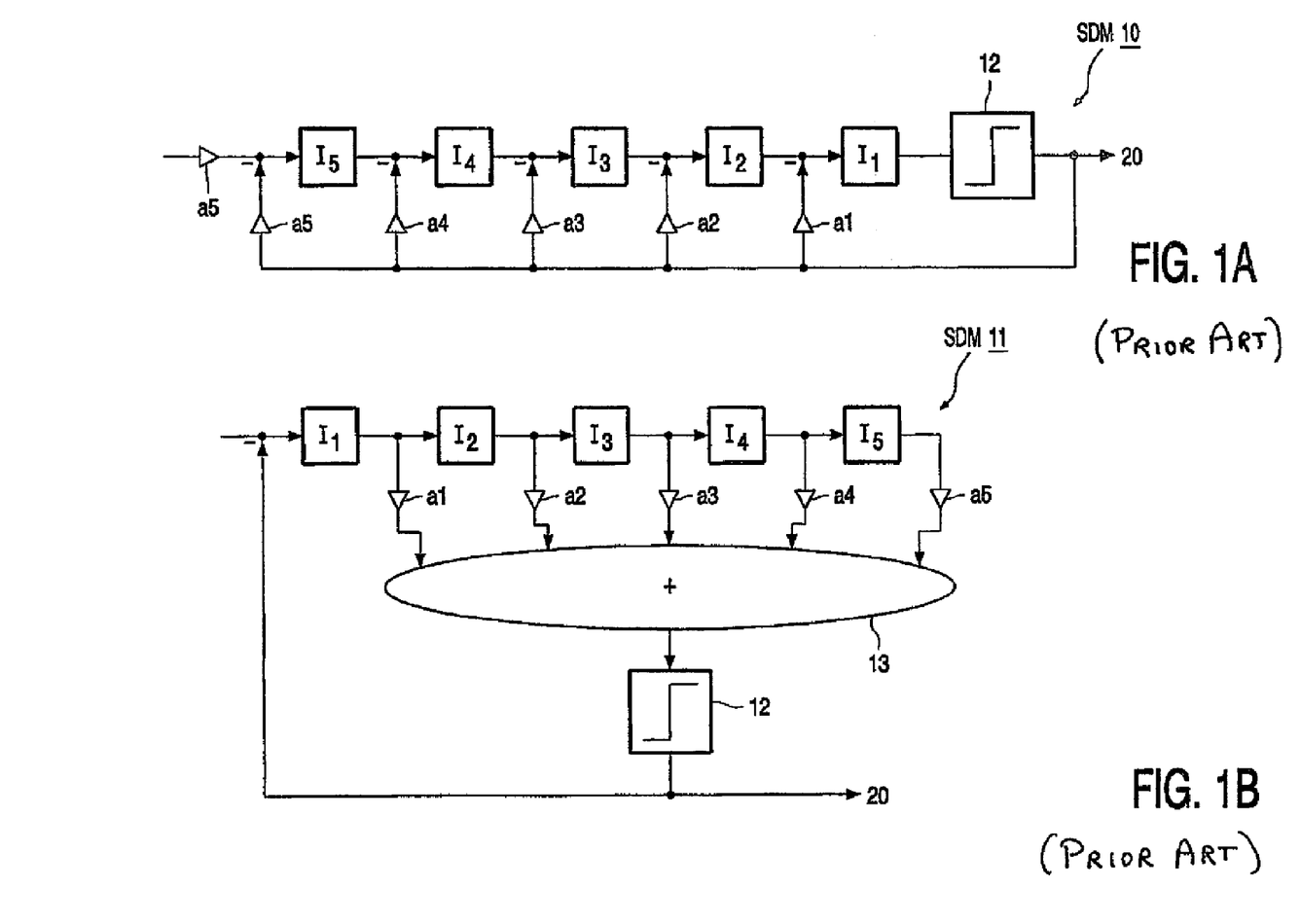
FIG. 1A shows the structure of a conventional feedback SDM.
FIG. 1B shows the structure of a conventional feed forward SDM.

FIG. 1A shows the structure of a conventional digital feedback Sigma Delta Modulator (SDM) 10. As shown, the output signal 20 of the quantizer 12 is fed back over the weights (or gains) $a_{1 \ldots n}$ ($n \geq 1$) and subtracted from the integrator $I_{1 \ldots n}$ inputs. FIG. 1B shows the structure of a conventional digital feed forward Sigma Delta Modulator (SDM) 11. As shown, the outputs of the integrators $I_{1 \ldots n}$ are weighted and summed (in summer 13). The output signal 20 of the quantizer 12 is fed back and subtracted from the input to the first integrator.

As long as the SDM 10 is stable, the values of the integrators $I_{1 \ldots n}$ are bounded. However, higher order (for example, above 2nd order) SDMs (in particular, 1-bit SDMs) are unstable for large input signals. This phenomenon may cause problems in Sigma Delta Analog to Digital Converters (ADCs) and Digital to Digital (DD) converters, because the input signal amplitude cannot be controlled (for example, in a live recording). Existing solutions to stabilize an SDM rendered unstable due to a large input are described below.

A characteristic of an unstable SDM is that the output signal 20 includes long strings of 0's or 1's. If long strings of equal outputs are detected, the SDM 10 may be reset. A disadvantage of this solution is that the output bitstream of the SDM 10 will contain a discontinuity which is very audible.

Another conventional solution, as taught in Tewksbury et al. "Oversampled, Linear Predictive, and Noise-Shaping Coders of Order N>1", IEEE Transactions on Circuits and Systems, Vol. 25, July 1978, includes the use of clippers. Just before a SDM becomes fully unstable, the value of the internal integrators increases quickly. By applying a limiter circuit to the values of the integrator $I_{1 \ldots n}$, the SDM 10 maintains stability. However, the stability is, in general, not unconditional and is only guaranteed for values slightly above the normal range of operation. When the clippers are active, the SNR degrades, dropping to low levels quickly. Further, the clippers also slightly degrade the SNR in the original stable useable area. Still further, the activation of clippers often leads to audible artifacts.

As described, conventional techniques for maintaining SDM stability have at least three disadvantages:
1. stability is not unconditional,
2. SNR performance is degraded, and
3. audible artifacts are introduced.

An object of the invention is to present a solution that improves the stability of a sigma-delta modulator (SDM).

To this end, the present invention provides a unit that includes n ($n \geq 1$) integrators in series, where a first of the n integrators receiving an input signal, at least one Q device, which acts as a quantizer when an absolute value of a signal input thereto is smaller and as a gain element when the absolute value of the signal input thereto is larger, and a device for quantizing an output of the unit.

In one or more exemplary embodiments, the unit is a feed back or feed forward SDM.

In one or more exemplary embodiments, the unit includes one Q device. In such an arrangement, the one Q device may be positioned so that the signal input to the one Q device is an output of the last integrator and the output of the one Q device $Q_1$ is input to the device for quantizing and/or to the feedback loops with weights to the n integrators.

In one or more exemplary embodiments, the unit includes m Q devices (where $m \leq n$). In such an arrangement, the signal input to the m Q devices, may be an output of the last integrator, the outputs of the m Q devices may be input to one or more of the n feedback loops with weighting to the integrators, and the output of the last integrator or the output of any of the m Q devices is input to the device for quantizing.

In an alternate arrangement, the signals output from the n integrators are weighted and summed, the summed output is input to the m devices, outputs of the m Q devices are input to one or more of the n integrators, and an output of one of the m Q devices is input to the device for quantizing.

In another alternate arrangement, the signals output from the n integrators are weighted and summed, the summed output is input to the m Q devices and the device for quantizing, and outputs of the m Q devices are input to one or more of the n integrators.

The exemplary units of the present invention may be components of an analog to digital converter and/or a digital to digital converter. The exemplary units of the present invention may process digital or analog signals, for example, a 1-bit signal.

In the exemplary embodiments with more than one Q device, each of the Q devices may have different parameters set to improve stability, improve SNR, and/or reduce introduction of artifacts.

Exemplary embodiments of the present invention may also be directed to a method including inputting a signal to n ($n \geq 1$) integrators $I_{1 \ldots n}$ in series, quantizing when an absolute value of a signal input thereto is smaller and amplifying when the absolute value of the signal input thereto is larger, and quantizing an output.

Other objectives of the invention are to present a solution that improves the SNR performance of an SDM and/or reduce audible artifacts, such as clicks and pops.

The present invention will become more fully understood from the detailed description given below and the accompanying drawings, which are given for purposes of illustration only, and thus do not limit the invention.

Figure 2:
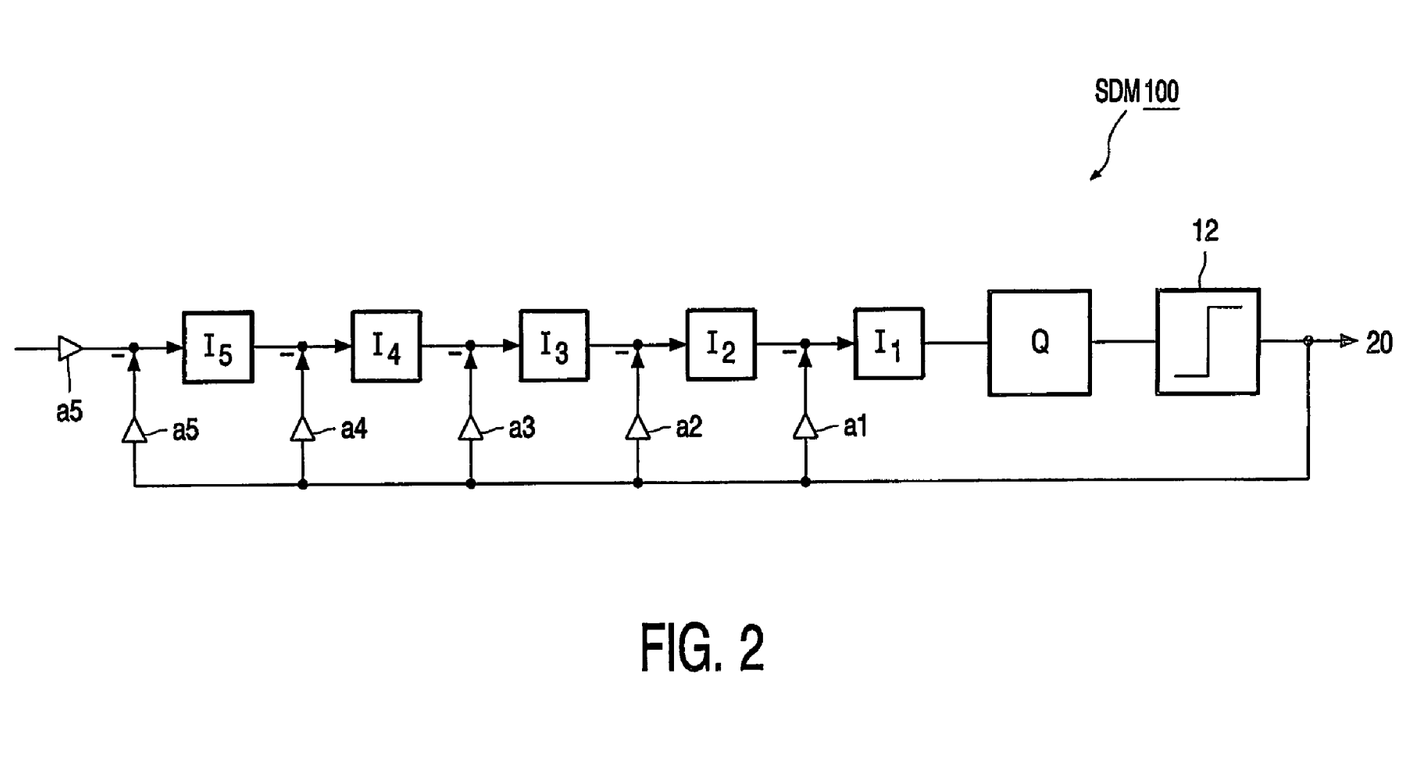
FIG. 2 shows the structure of a feedback SDM in accordance with an exemplary embodiment of the present invention.

FIG. 2 shows the structure of a feedback SDM 100 in accordance with an exemplary embodiment of the present invention. The exemplary embodiment reduces or prevents uncontrolled growth of integrator $I_{1...n}$ values (an indicator of instability) by replacing the conventional quantizer (for example a 1-bit quantizer) with a device Q that acts as a normal quantizer for smaller inputs, but acts as a gain element with offset (equal to or different from zero) for larger inputs. As shown in FIG. 2, the output of the device Q is used as feed back signal to the gains $a_{1...n}$. The final output is created by also quantizing the output of the last integrator using a normal quantizer.

Figure 3:
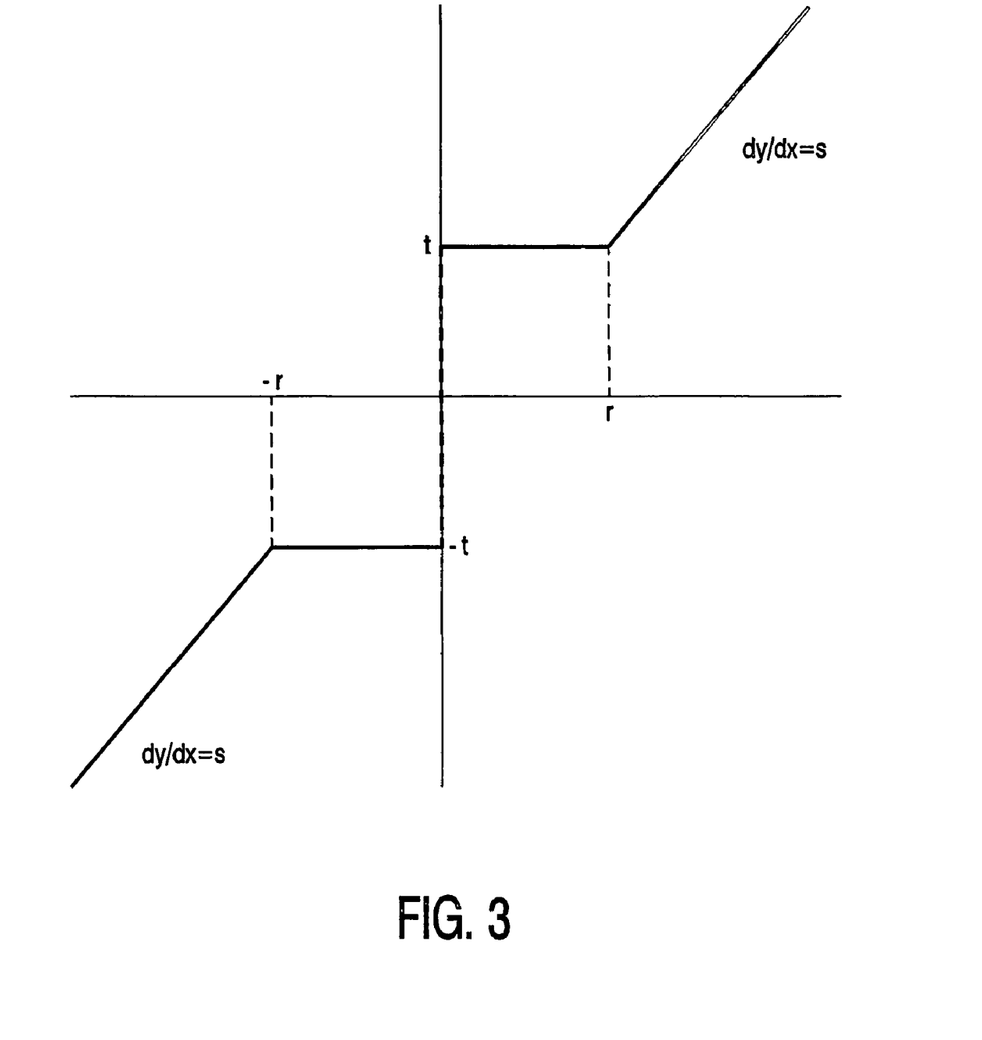
FIG. 3 shows a generic transfer function of the device Q in accordance with an exemplary embodiment of the present invention.

FIG. 3 shows an example generic transfer function of the device Q in accordance with an exemplary embodiment of the present invention. The generic transfer function may be defined as follows:

for small positive inputs (range [0, r]) the output is equal to t;

for large positive inputs (range <r, inf>) the output is t+(x−r)•s;

for small negative inputs (range [−r, 0]) the output is equal to −t; and for large negative inputs (range <−inf, −r>) the output is −t+(x+r)•s.

Exemplary values for the parameters may be $r \in [1, 2]$, $s \in [0, 10]$, $t \in [0, 1]$. If s=0 and t=1, the behavior is equal to that of a conventional 1-bit quantizer 12. For s≠0, the output of the device Q is not a 1-bit signal, but a multi-bit signal.

By choosing proper values for r, s, and t, SDM 100 performance can be improved. With the exemplary structure of FIG. 2, it is possible to create an SDM that is unconditionally stable (sustained inputs with an amplitude of 0 dB compared to the output level of the quantizer 12 will not drive the SDM 100 unstable).

Figure 4:
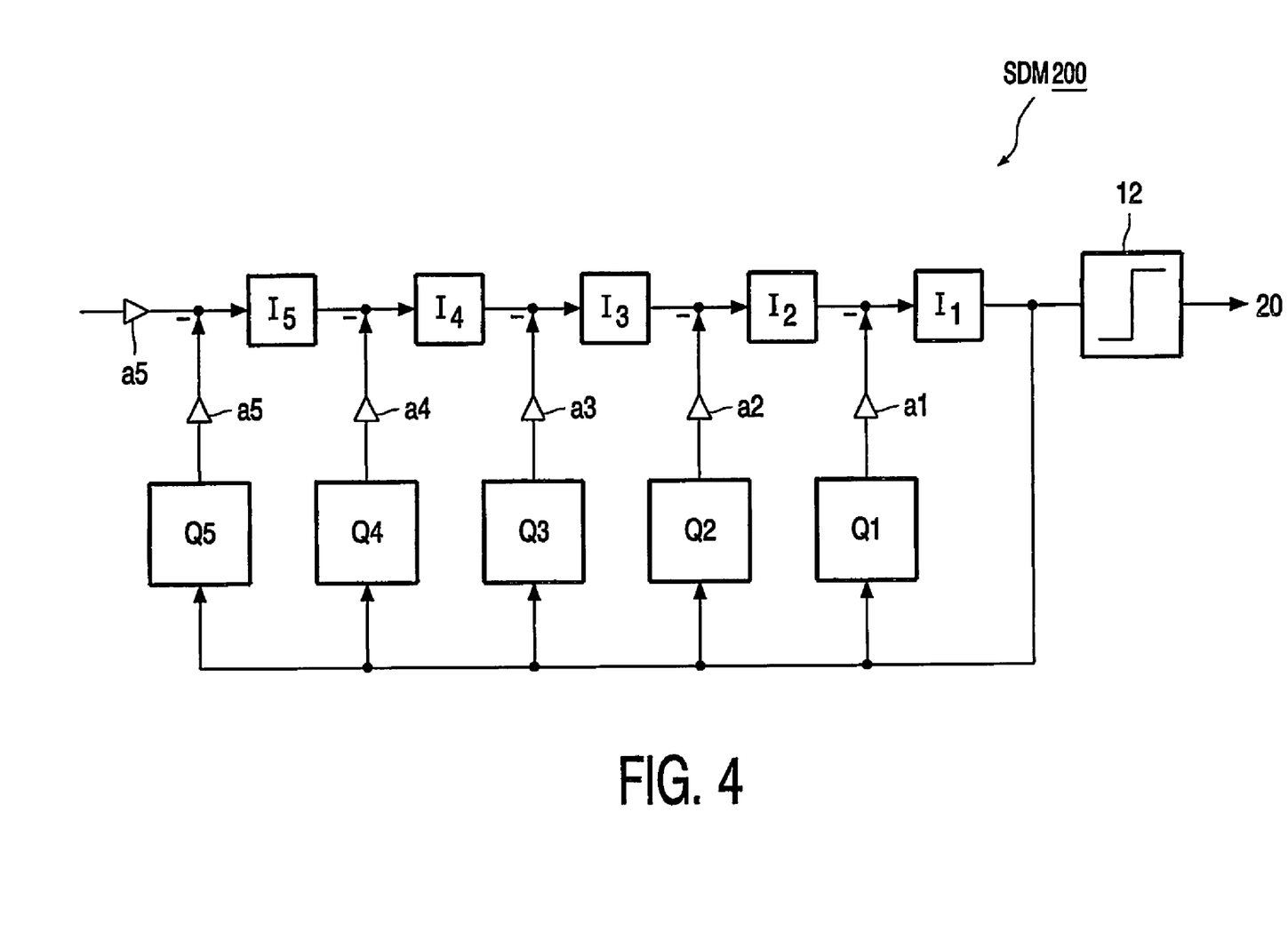
FIG. 4 shows the structure of a feedback SDM in accordance with another exemplary embodiment of the present invention.

FIG. 4 shows the structure of a feedback SDM 200 in accordance with another exemplary embodiment of the present invention. The SDM 200 includes devices $Q_{1...m}$. In the exemplary embodiment of FIG. 4, each of the devices $Q_{1...m}$ may have different settings. This makes it possible to have 1. an unconditionally stable SDM—by choosing the parameters of the different devices $Q_{1...m}$ appropriately, the SDM can be made with improved SNR; and/or 2. an SDM with improved or optimized SNR for a limited input range—the SNR can be improved or optimized for a given input range while outside the given input range, the SDM becomes unstable.

Whereas conventional techniques such as clippers, degrade the SNR already in the original stable regime, the exemplary embodiments of the present invention do not necessarily pose this drawback. In the normally unstable regime, the SNR performance can remain very high and fall off only slowly until instability is reached. Clicks and pops are avoided. A further possibility is the stabilization of higher order (7 or higher) SDMs, which turn instable when clippers are active.

EXAMPLE 1

An example SDM with the structure of FIG. 2 has been created. The SDM is a 5th order, 64 times oversampled (64*44100 Hz), with corner frequency 100 kHz (butterworth highpass design). The coefficients $a_{1...5}$ are 0.719981, 0.252419, 0.052997, 0.006604, and 0.000389. The device Q has normal quantizer behavior for inputs between −1.5 and 1.5 (r=1.5). The slope s of the device Q is 0.9. Q has t=1.0.

Figure 5:
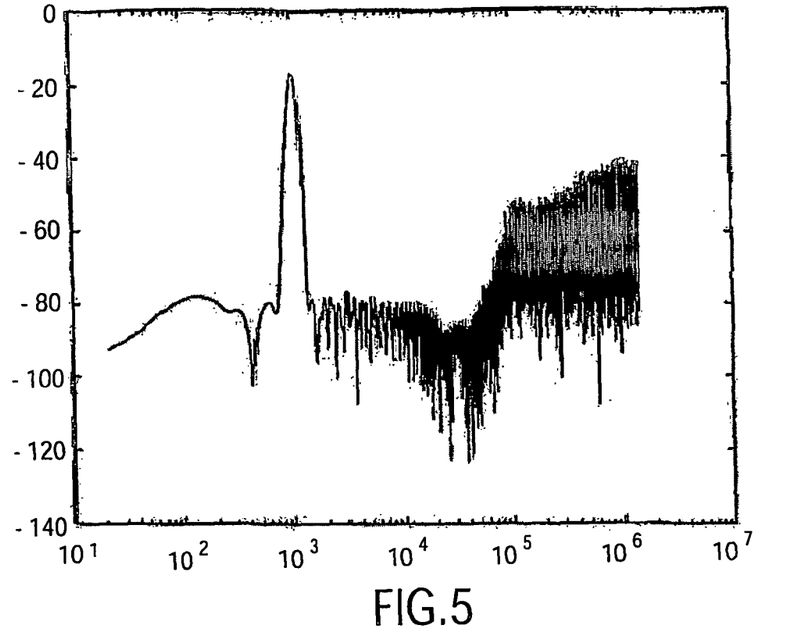
FIG. 5 shows the resulting spectrum of an SDM structure in accordance with an exemplary embodiment of the present invention for an input sine of 1 kHz with amplitude 0.7.

Table 1 shows the achieved SNR for various sine inputs (sine frequency 1 kHz) for both a conventional SDM (without the device Q) and the SDM structure in accordance with the exemplary embodiment of FIG. 2 (with the device Q). Whereas the conventional SDM becomes unstable for inputs of 0.65 and higher, the SDM structure in accordance with the exemplary embodiment of FIG. 2 is unconditionally stable. The performance of the SDM structure in accordance with the exemplary embodiment of FIG. 2 is equal to the conventional SDM for inputs up to 0.65. Above inputs of 0.65 the SNR drops. FIG. 5 shows the resulting spectrum of the SDM structure in accordance with the exemplary embodiment of FIG. 4 for an input sine of 1 kHz with amplitude 0.7.

TABLE 1

| Input Amplitude | SNR (dB) (conventional quantizer) | SNR (dB) (FIG. 2 embodiment) |
| --- | --- | --- |
| 0.1 | 85.41 | 85.41 |
| 0.2 | 90.20 | 90.20 |
| 0.3 | 95.63 | 95.63 |
| 0.4 | 97.60 | 97.60 |
| 0.5 | 100.05 | 100.05 |
| 0.6 | 100.54 | 100.54 |
| 0.64 | 101.96 | 101.96 |
| 0.65 | 101.33 | 101.33 |
| 0.66 | 0 | 67.40 |
| 0.7 | 0 | 44.72 |
| 0.8 | 0 | 25.30 |
| 0.9 | 0 | 23.18 |
| 1.0 | 0 | 21.98 |

EXAMPLE 2

In this example the SDM is a 5th order, 64 times oversampled (64*44100 Hz), with corner frequency 80 kHz (butterworth highpass design). The coefficients $a_{1...5}$ are 0.576107, 0.162475, 0.027609, 0.002805, and 0.000136. Devices $Q_1$, $Q_2$ and $Q_3$ have normal quantizer behavior for inputs between −1 and 1 (r=1). Devices $Q_4$ and $Q_5$ have r=1.1. The slopes of devices $Q_{1...5}$ are 1.5, 1.4, 0.45, 0.1, and 0.1. The parameter t of devices $Q_{1...5}$ is 1.0. Table 2 lists the obtained SNR for sine inputs with frequency 1000 Hz. The first column lists the input amplitude. The second column shows the performance of the conventional quantizer, the third column, the performance with devices $Q_{1...5}$.

Figure 6:
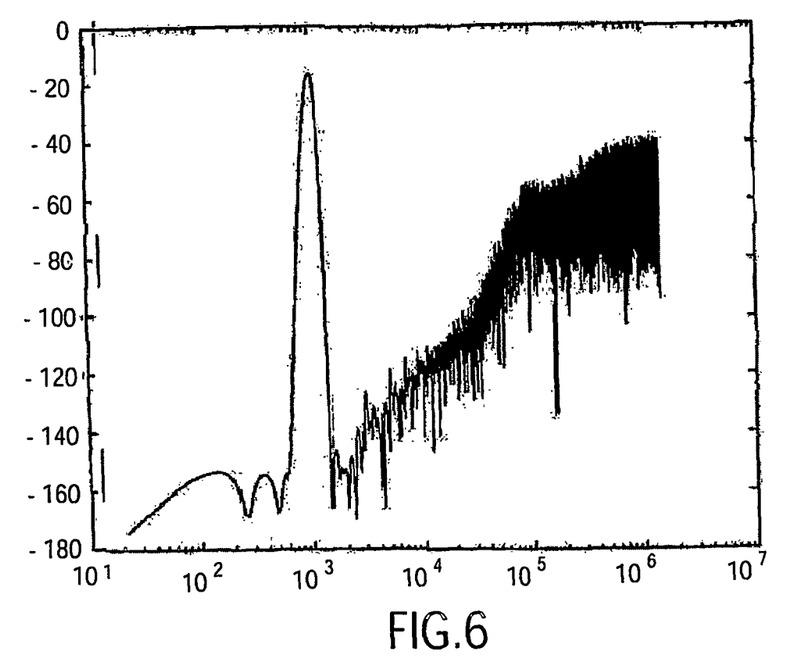
FIG. 6 shows the resulting spectrum of an SDM structure in accordance with an exemplary embodiment of the present invention for an input sine of 1 kHz with amplitude 0.8.

By using well chosen parameters for the different $Q_{1...5}$, (or in the generic case, for $Q_{1...m}$) it is possible to reduce the effective order of the SDM for high input amplitudes. FIG. 6 shows the power spectrum of the SDM structure in accordance with the exemplary embodiment of FIG. 4 for an input sine of 1 kHz with amplitude 0.8. The low frequency part of the spectrum has 2nd order behavior, the high frequency part is 5th order. The exact frequency where the behavior changes from $2^{nd}$ to $5^{th}$, is dependent on the input amplitude.

Although difficult to quantitatively express, perceived audio quality is very important. In the case of conventional clippers perceived audio quality degrades very fast in the original unstable area. The SDM structure in accordance with the exemplary embodiment of FIG. 4 maintains much better audio quality in this region.

TABLE 2

| Input Amplitude | SNR (dB) (conventional quantizer) | SNR (dB) (FIG. 4 embodiment) |
| --- | --- | --- |
| 0.1 | 77.15 | 77.15 |
| 0.2 | 83.76 | 83.76 |
| 0.3 | 87.58 | 87.58 |
| 0.4 | 89.62 | 89.62 |
| 0.5 | 91.59 | 91.59 |
| 0.6 | 95.44 | 95.44 |
| 0.7 | 95.29 | 95.29 |
| 0.8 | 0 | 76.73 |
| 0.9 | 0 | 66.68 |
| 1.0 | 0 | 38.60 |

As described and illustrated above, FIGS. 2 and 4 are both directed to feedback SDMs. As shown, a feedback SDM may include n integrators in series, where the output of the last integrator is input to a quantizer. The output of the quantizer is the SDM output and is subtracted from the input signal. The signal, which is the difference between the input signal and the quantizer output, is input to the first integrator.

However, the present invention may be applied to other SDMs, such as feed forward SDMs. A feed forward SDM may include n integrators in series, where the output of each integrator is weighted and summed. The sum is input to a quantizer and the output of the quantizer is the SDM output. The signal, which is the difference between the input signal and the quantizer output, is input to the first integrator.

Figure 7:
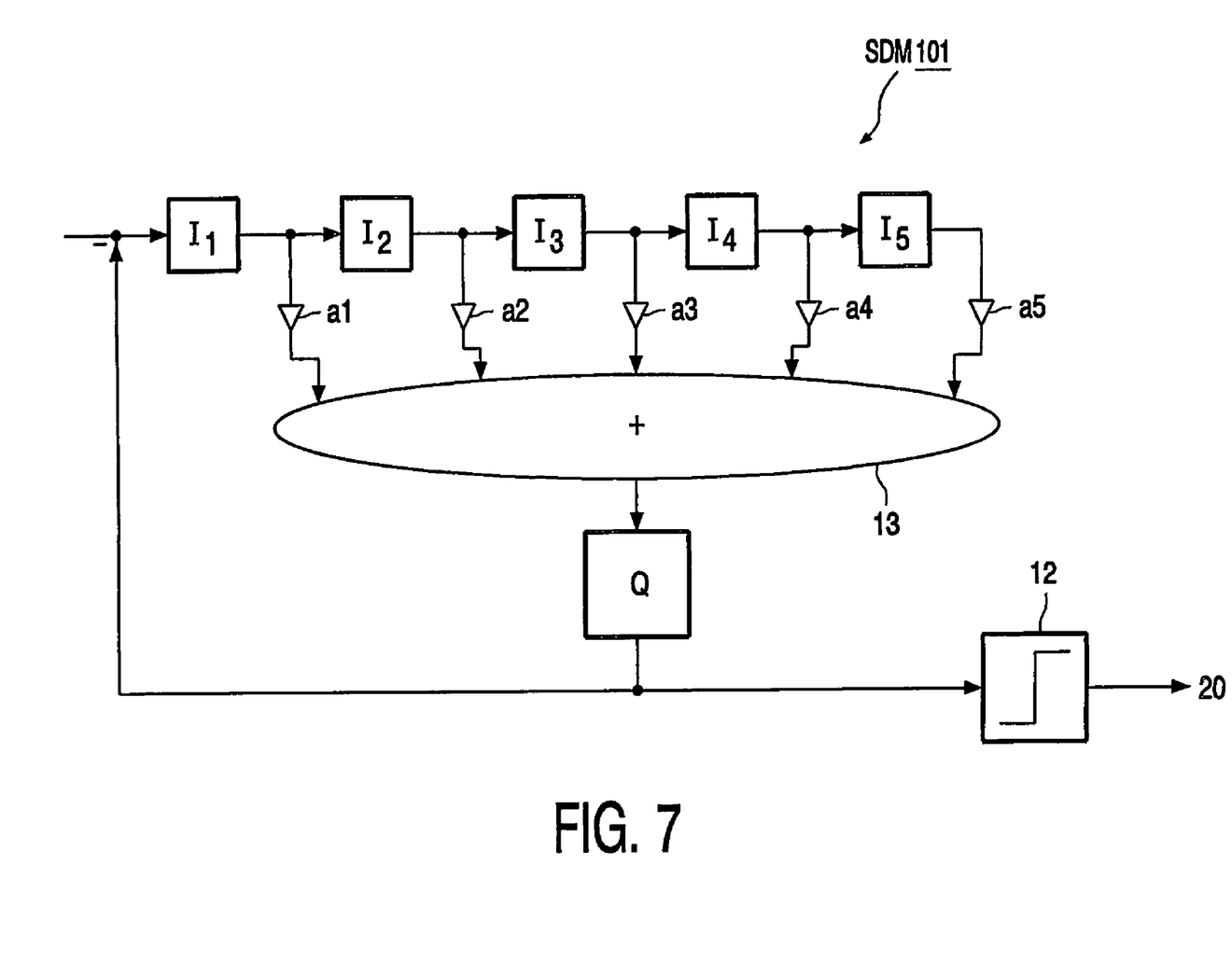
FIG. 7 shows the structure of a feed forward SDM in accordance with an exemplary embodiment of the present invention.

FIG. 7 shows the structure of a feed forward SDM 101 in accordance with an exemplary embodiment of the present invention. The exemplary embodiment reduces or prevents uncontrolled growth of integrator $I_{1...n}$ values (an indicator of instability) by replacing the conventional quantizer (for example a 1-bit quantizer) with a device Q that acts as a normal quantizer for smaller inputs, but acts as a gain element with offset (equal to or different from zero) for larger inputs. As shown in FIG. 7, the output of the device Q is output to the quantizer and subtracted from the input to the first integrator. The final output of the SDM 101 is created by also quantizing the output of the last integrator using a normal quantizer 12.

By choosing proper values for r, s, and t, SDM 101 performance can be improved. With the exemplary structure of FIG. 7, it is possible to create an SDM that is unconditionally stable (sustained inputs with an amplitude of 0 dB compared to the output level of the quantizer 12 will not drive the SDM 101 unstable).

Figure 8:
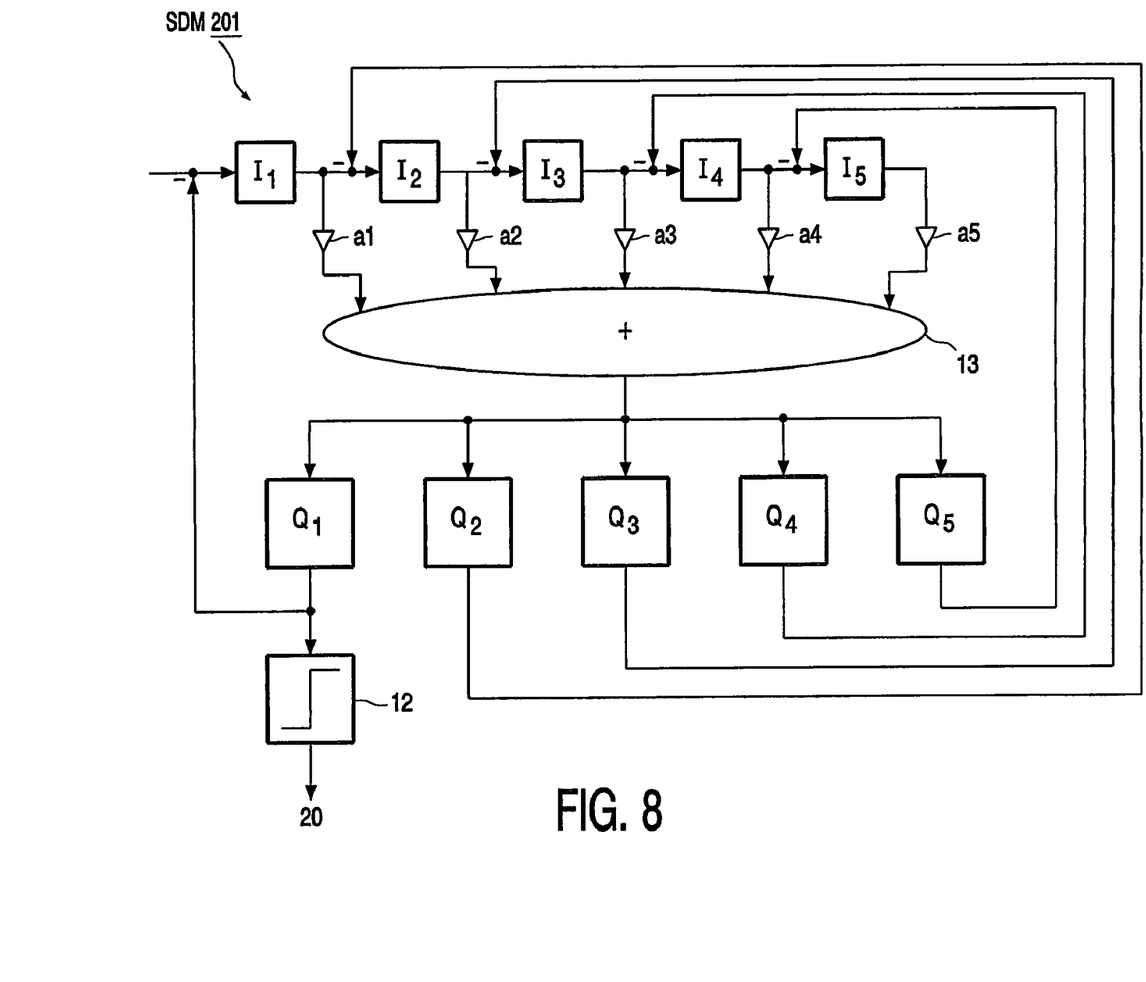
FIG. 8 shows the structure of a feed forward SDM in accordance with another exemplary embodiment of the present invention.

FIG. 8 shows the structure of a feed forward SDM 201 in accordance with another exemplary embodiment of the present invention. The SDM 201 includes devices $Q_{1...m}$. In the exemplary embodiment of FIG. 8, each of the devices $Q_{1...m}$ may have different settings. Exemplary values for t are 0.0 and 1.0. As shown in FIG. 8, the output of the summer 13 is input to each of the devices $Q_{1...m}$. The output of the devices $Q_{1...m}$ are subtracted from one or more of the integrators $I_{1...n}$. The output of one of the devices $Q_{1...m}$ or summer 13 is also input to the quantizer 12 to produce the output signal 20.

Figure 9:
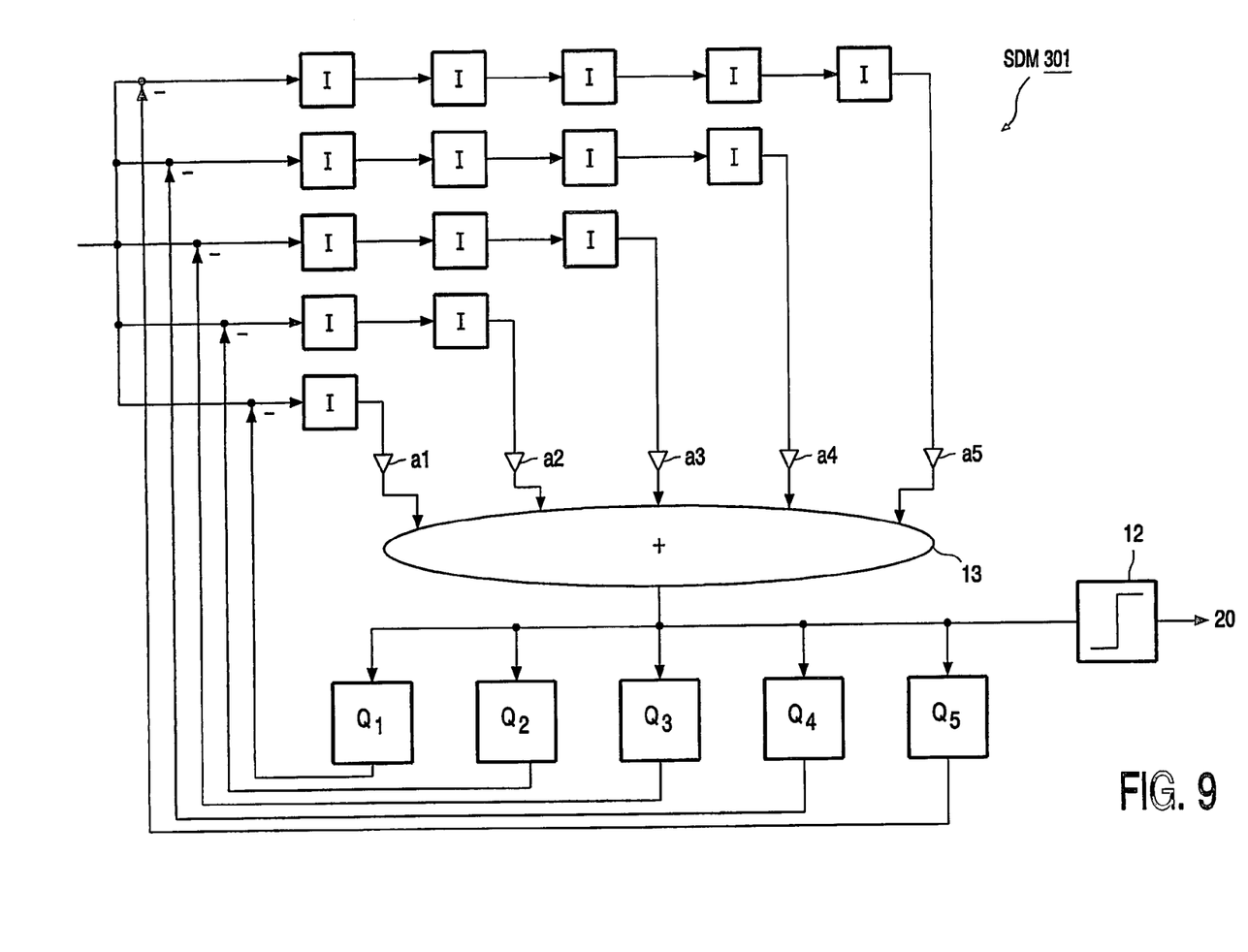
FIG. 9 shows the structure of a feed forward SDM in accordance with another exemplary embodiment of the present invention.

FIG. 9 shows the structure of a feed forward SDM 301 in accordance with another exemplary embodiment of the present invention. The SDM 301 includes devices $Q_{1...m}$. In the exemplary embodiment of FIG. 9, each of the devices $Q_{1...m}$ may have different settings. As shown in FIG. 9, the output of the summer 13 is input to each of the devices $Q_{1...m}$ and the also input to the quantizer 12 to produce the output signal 20.

As described and illustrated above, FIGS. 2, 4, 7, 8, and 9 illustrate digital SDMs. However, the present invention may be applied to analog SDMs (either feed back or feed forward).

It is further noted that the features of the present invention are usable with many types of SDMs and noise shapers, including feedback, feed forward, continuous, discrete time, software, hardware, analog, digital, SC-filter, dithered, undithered, low order, high order, single-bit, multi-bit or any combination of these features, as well as other devices such as noise shapers, either in combination (for example, cascaded) with SDMs and/or other devices or alone.

It is further that the structural and functional features of the various exemplary embodiments described above may be used interchangeably, individually or in combination. For example, the quantizer 12 could also be any known quantizer equivalent.

The device according to embodiments of the invention may be included in an ADC and/or DD converter. Such an ADC and/or DD converter may be part of signal processing applications/devices for Super Audio CD (SACD) equipment, e.g. a player.

It is noted that the processing described above is particular useful in the processing of DSD.

It is further noted that that the input need not be restricted to a bitstream; the input may be analog or digital. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claims. The word "comprising" does not exclude the presence of other elements or steps than those listed in a claim. The modifiers "a", "an", "one" and "at least one" as used in the appended claims all are intended to include one or more of whatever they modify. The invention can be implemented by means of hardware comprising several distinct elements, and by means of a suitable programmed computer. In a device claim enumerating several means, several of these means can be embodied by one and the same item of hardware. The mere factor that certain measures are recited in mutually different dependent claims does not indicate that a combination of these measures cannot be used to advantage.

The invention claimed is:

1. A unit comprising:
   n (n≧1) integrators ($I_{1...n}$) in series, a first of the n integrators ($I_{1...n}$) receiving an input signal;
   a first device which acts as a quantizer when an absolute value of a signal input to the first device is smaller than a predetermined value, and acts as a gain element when the absolute value is larger than the predetermined value; and
   a second device for quantizing an output of the unit.

2. The unit of claim 1, wherein the first device acts as a gain device, with or without an offset.

3. The unit of claim 2, wherein the signal input to the first device is an output of a first integrator of the integrators and an output of the first device is input to the second device and as weighted feedback paths to the n integrators ($I_{1...n}$).

4. The unit of claim 2, wherein the signal input to the first device is an output of a first integrator of the integrators and the output of the first integrator ($I_n$) is input to the second device, and an output of the first device is input to weighted feedback paths to the n integrators ($I_{1...n}$).

5. The unit of claim 2, wherein signals output from the n integrators $I_{1...n}$ are weighted and summed and the summed output is input to the first device, and wherein an output of the first device is input to the second device and to an integrator of the n integrators.

6. The unit of claim 2, wherein signals output from the n integrators ($I_{1...n}$) are weighted and summed and the summed output is input to the first device and the second device, and an output of the first device is input to an integrator of the n integrators.

7. The unit of claim 2, wherein the signal input to the first device is an output of an integrator of the n integrators, and wherein an output of the first device is input as weighted feedback paths to one or more of the n integrators ($I_{1...n}$) and the output of the integrator is input to the second device.

8. The unit of claim 2, wherein the signal input to the first device is an output of an integrator of the n integrators, and wherein an output of the first device is input as weighted feedback paths to one or more of the n integrators, and wherein the output of the first device is input to second device.

9. The unit of claim 2, wherein signals output from the n integrators ($I_{1...n}$) are weighted and summed, the summed output is input to the first device and wherein an output of the first device is input to one or more of the n integrators ($I_{1...n}$), and the output of the first device is input to the second device.

10. The unit of claim 2, wherein signals output from the n integrators ($I_{1...n}$) are weighted and summed by a summer, the summed output is input to the first device, and wherein an output of the first device is input to one or more of the n integrators ($I_{1...n}$), and an output of the summer is input to the second device.

11. The unit of claim 2, wherein signals output from the n integrators ($I_{1...n}$) are weighted and summed, the summed output is input to the first device and the second device, and wherein an output of the first device is input to one or more of the n integrators.

12. The unit of claim 2, wherein signals output from the n integrators ($I_{1...n}$) are weighted and summed, the summed output is input to the first device, and wherein an output of the first device is input to one or more of the n integrators ($I_{1...n}$) and the output of the first device is input to second device.

13. An analog to digital converter including the unit of claim 1.

14. A digital to digital converter including the unit of claim 1.

15. The unit of claim 1, further comprising a plurality of the first device each having different parameters set to improve stability, improve SNR, and/or reduce introduction of artifacts.

16. A method comprising the acts of:
inputting a signal to n (n≧1) integrators ($I_{1...n}$) in series to output an integrated signal;
forming an output signal by quantizing the integrated signal when an absolute value of the integrated signal is smaller than a predetermined value, and amplifying, with or without offset, when the absolute value is larger than the predetermined value; and
quantizing the output signal.

17. A unit comprising:
means for integrating a signal to form an integrated signal;
means for forming an output signal by quantizing the integrated signal when an absolute value of the integrated signal is smaller than a predetermined value, and amplifying the integrated signal when the absolute is larger than the predetermined value; and
means for quantizing the output signal.

18. The unit of claim 17, further comprising weighting means located between the means for integrating and the means for forming.

19. The unit of claim 17, wherein the means for integrating includes a plurality of integrators, and the unit further comprises summing means for summing outputs of the plurality of integrators to provide an input to the means for forming.

20. The unit of claim 17, wherein the means for forming include a plurality of devices having parameters chosen to reduce an effective order of the unit when the signal has a first amplitude and to increase the effective order when the signal has a second amplitude.

* * * * *